(12) United States Patent
Murai et al.

(10) Patent No.: US 9,030,619 B2
(45) Date of Patent: May 12, 2015

(54) SEMICONDUCTOR DEVICE, METHOD FOR MANUFACTURING SEMICONDUCTOR DEVICE, AND LIQUID CRYSTAL DISPLAY DEVICE

(75) Inventors: Atsuhito Murai, Osaka (JP); Yukinobu Nakata, Osaka (JP); Shingo Kawashima, Osaka (JP); Jun Nishimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 122 days.

(21) Appl. No.: 13/992,440

(22) PCT Filed: Nov. 29, 2011

(86) PCT No.: PCT/JP2011/077493
§ 371 (c)(1),
(2), (4) Date: Sep. 24, 2013

(87) PCT Pub. No.: WO2012/077527
PCT Pub. Date: Jun. 14, 2012

(65) Prior Publication Data
US 2014/0009713 A1    Jan. 9, 2014

(30) Foreign Application Priority Data

Dec. 10, 2010   (JP) .................................. 2010-275885

(51) Int. Cl.
*G02F 1/1362*   (2006.01)
*G02F 1/1335*   (2006.01)
(Continued)

(52) U.S. Cl.
CPC .................... *G02F 1/136209* (2013.01); *G02F 2001/136222* (2013.01); *G02F 1/133512* (2013.01); *G02F 1/133707* (2013.01); *H01L 27/1225* (2013.01);
(Continued)

(58) Field of Classification Search
CPC ................................................. G02F 1/136209
See application file for complete search history.

(56) References Cited

U.S. PATENT DOCUMENTS 5,745,194 A    4/1998   Nakashima et al.
6,057,896 A    5/2000   Rho et al.
(Continued)

FOREIGN PATENT DOCUMENTS

JP    03-042123 U    4/1991
JP    03-227062 A    10/1991
(Continued)

OTHER PUBLICATIONS

English translation of Official Communication issued in corresponding International Application PCT/JP2011/077493, mailed on Jun. 20, 2013.
(Continued)

*Primary Examiner* — Dennis Y Kim
(74) *Attorney, Agent, or Firm* — Keating & Bennett, LLP (57) ABSTRACT

A semiconductor device (100A) according to the present invention includes: a thin-film transistor (10); a first insulating layer (9) which has been formed over the thin-film transistor (10); a second insulating layer (11) which has been formed on the first insulating layer (9) and which has a hole (21a); and an opaque layer (12a) which is arranged so as to overlap an oxide semiconductor layer (5) when viewed along a normal to the substrate (1). The opaque layer (12a) has been formed in the hole (21a). The opaque layer (12a) has a raised and curved upper surface and the upper surface of the second insulating layer (11) is located closer to the substrate (1) than the upper surface of the opaque layer (12a) is.

15 Claims, 7 Drawing Sheets

(51) Int. Cl.
*H01L 29/786* (2006.01)
*H01L 27/12* (2006.01)
*H01L 29/66* (2006.01)
*G02F 1/1337* (2006.01)
*G02F 1/1333* (2006.01)
*H01L 27/32* (2006.01)

(52) U.S. Cl.
CPC ...... *H01L 29/78633* (2013.01); *H01L 29/7869* (2013.01); *H01L 29/78693* (2013.01); *H01L 29/66969* (2013.01); *G02F 2201/40* (2013.01); *G02F 1/133345* (2013.01); *H01L 27/3272* (2013.01)

(56) References Cited

U.S. PATENT DOCUMENTS

| | | | |
|---|---|---|---|
| 2003/0043336 A1 | 3/2003 | Sasaki et al. | |
| 2003/0090601 A1 | 5/2003 | Kim et al. | |
| 2004/0201048 A1* | 10/2004 | Seki et al. | 257/294 |
| 2007/0139597 A1* | 6/2007 | Shim et al. | 349/139 |
| 2007/0171337 A1* | 7/2007 | Kim et al. | 349/110 |
| 2009/0057671 A1* | 3/2009 | Ryu et al. | 257/59 |
| 2010/0007811 A1* | 1/2010 | Choi | 349/43 |
| 2010/0065848 A1* | 3/2010 | Lee et al. | 257/59 |
| 2010/0134397 A1* | 6/2010 | Ishitani et al. | 345/92 |
| 2010/0134710 A1 | 6/2010 | Ishitani et al. | |
| 2010/0245698 A1* | 9/2010 | Kim et al. | 349/46 |
| 2011/0175870 A1* | 7/2011 | Ohue | 345/206 |
| 2011/0285940 A1* | 11/2011 | Kubota et al. | 349/86 |

FOREIGN PATENT DOCUMENTS

| | | |
|---|---|---|
| JP | 08-015670 A | 1/1996 |
| JP | 10-186408 A | 7/1998 |
| JP | 2001-033816 A | 2/2001 |
| JP | 2003-140189 A | 5/2003 |
| JP | 2003-149647 A | 5/2003 |
| JP | 2003-273361 A | 9/2003 |
| JP | 2009-151204 A | 7/2009 |
| JP | 2010-156960 A | 7/2010 |
| JP | 2010-181838 A | 8/2010 |

OTHER PUBLICATIONS

Official Communication issued in International Patent Application No. PCT/JP2011/077493, mailed on Dec. 27, 2011.

* cited by examiner

SEMICONDUCTOR DEVICE, METHOD FOR MANUFACTURING SEMICONDUCTOR DEVICE, AND LIQUID CRYSTAL DISPLAY DEVICE

TECHNICAL FIELD

The present invention relates to a semiconductor device with a thin-film transistor (TFT) including an oxide semiconductor layer, and also relates to a method for fabricating such a semiconductor device, and a liquid crystal display device.

BACKGROUND ART

Recently, TFTs including an oxide semiconductor layer that contains In (indium), Zn (zinc) or Ga (gallium) have been developed extensively by a lot of people (see Patent Document No. 1, for example). Such a TFT including an oxide semiconductor layer (which will be referred to herein as an "oxide semiconductor TFT") is characterized by its high mobility.

Patent Document No. 1 discloses a liquid crystal display device in which an opaque layer with the ability to attenuate the light intensity of visible radiation is arranged to cover the oxide semiconductor layer, thereby stabilizing the operating characteristic of an oxide semiconductor TFT. Patent Document No. 1 also discloses a liquid crystal display device in which such an opaque layer forms part of an interlayer film.

Meanwhile, liquid crystal display devices, of which the aperture ratio is increased by forming a black matrix (BM) on an array substrate, are disclosed in Patent Documents Nos. 2 and 3.

CITATION LIST

Patent Literature

Patent Document No. 1: Japanese Laid-Open Patent Publication No. 2010-156960
Patent Document No. 2: Japanese Laid-Open Patent Publication No. 2001-33816
Patent Document No. 3: Japanese Laid-Open Patent Publication No. 10-186408
Patent Document No. 4: Japanese Laid-Open Patent Publication No. 2003-140189
Patent Document No. 5: Japanese Laid-Open Patent Publication No. 2009-151204
Patent Document No. 6: Japanese Laid-Open Patent Publication No. 2010-181838

SUMMARY OF INVENTION

Technical Problem

However, in the liquid crystal display device disclosed in Patent Document No. 1 in which an opaque layer forms part of the interlayer film, the alignment of liquid crystal molecules in its liquid crystal layer may be disturbed, and eventually some defects may be caused during a display operation, according to the shape of the opaque layer, which is a problem.

The present inventors perfected our invention in order to overcome such a problem by providing a semiconductor device, of which the TFT performance and display quality are not easily affected by the incoming light, a method for fabricating such a semiconductor device, and a liquid crystal display device.

Solution to Problem

A semiconductor device according to an embodiment of the present invention includes: a substrate; a thin-film transistor which is supported on the substrate and which includes a source electrode, a drain electrode and an oxide semiconductor layer; a first insulating layer which has been formed over the thin-film transistor; a second insulating layer which has been formed on the first insulating layer and which has either a first hole or a first recess; and a first opaque layer which is arranged so as to overlap the oxide semiconductor layer when viewed along a normal to the substrate. The first opaque layer has been formed in the first hole or the first recess. The first opaque layer has a raised and curved upper surface and the upper surface of the second insulating layer is located closer to the substrate than the upper surface of the first opaque layer is.

In one embodiment, the distance from the upper surface of the second insulating layer to the crest of the upper surface of the first opaque layer is longer than 0 nm and equal to or shorter than 1500 nm.

In one embodiment, the first opaque layer is made of a black resin.

In one embodiment, the semiconductor device further includes: a source line which is electrically connected to the source electrode; and a second opaque layer which is arranged so as to overlap the source line when viewed along a normal to the substrate. The second insulating layer further has either a second hole or a second recess. The second opaque layer has been formed in the second hole or the second recess. And the second opaque layer has a raised and curved upper surface and the upper surface of the second insulating layer is located closer to the substrate than the upper surface of the second opaque layer is.

In one embodiment, the distance from the upper surface of the second insulating layer to the crest of the upper surface of the second opaque layer is longer than 0 nm and equal to or shorter than 1500 nm.

In one embodiment, the second opaque layer is made of a black resin.

In one embodiment, the semiconductor device includes a conductive layer which has been formed on the second insulating layer. The second insulating layer and the first opaque layer contact with each other to define a first interface. The second insulating layer and the second opaque layer contact with each other to define a second interface. Either the first interface or the second interface is at least partially located under the conductive layer.

In one embodiment, the semiconductor device includes a drain line which is electrically connected to the drain electrode, and the source line and the drain line have been formed on a layer that is made of the same material as the oxide semiconductor layer.

In one embodiment, the oxide semiconductor layer includes In, Ga and Zn.

In one embodiment, the second insulating layer has oil repellency.

A liquid crystal display device according to an embodiment of the present invention includes a semiconductor device according to any of the embodiment described above.

In one embodiment, the liquid crystal display device includes a vertical alignment liquid crystal layer. Each pixel region of the liquid crystal display device has first, second, third and fourth liquid crystal domains in which liquid crystal molecules are aligned in first, second, third and fourth directions, respectively, when a voltage is applied to the liquid crystal layer. The first, second, third and fourth directions are defined so that the difference between any two of these four directions becomes substantially an integral multiple of 90 degrees. The first, second, third and fourth liquid crystal domains are arranged in two columns and two rows to form a matrix pattern in which each of these four liquid crystal domains is adjacent to the other liquid crystal domains. A third opaque layer is arranged so as to selectively shield, from incoming light, at least a part of a boundary area in which each of the first, second, third and fourth liquid crystal domains is adjacent to the other liquid crystal domains. The second insulating layer further has either a third hole or a third recess. The third opaque layer has been formed in the third hole or the third recess. The third opaque layer has a raised and curved upper surface and the upper surface of the second insulating layer is located closer to the substrate than the upper surface of the third opaque layer is.

In one embodiment, the distance from the upper surface of the second insulating layer to the crest of the upper surface of the third opaque layer is longer than 0 nm and equal to or shorter than 1500 nm.

In one embodiment, the third opaque layer is made of a black resin.

In one embodiment, the liquid crystal display device includes a conductive layer which has been formed on the second insulating layer. The third opaque layer and the second insulating layer contact with each other to define a third interface. The third interface is at least partially located under the conductive layer.

A semiconductor device fabricating method according to an embodiment of the present invention is a method for fabricating a semiconductor device according to any of the embodiments described above, and includes the step of making the second insulating layer of an organic material with oil repellency.

In one embodiment, the method for fabricating the semiconductor device includes the steps of: (A) forming the second insulating layer; and (B) making the second insulating layer oil repellent by performing plasma processing using a fluorine based gas after the step (A) has been performed.

Advantageous Effects of Invention

The present invention provides a semiconductor device, of which the TFT performance and display quality are not easily affected by the incoming light, a method for fabricating such a semiconductor device, and a liquid crystal display device.

BRIEF DESCRIPTION OF DRAWINGS

FIG. 1 (*a*) is a schematic plan view illustrating a semiconductor device 100A as an embodiment of the present invention, (b) is a schematic cross-sectional view of the semiconductor device 100A as viewed on the plane A1-A1' shown in FIG. 1(*a*), and (c) is a schematic cross-sectional view of the semiconductor device 100A as viewed on the plane A2-A2' shown in FIG. 1(*a*).

FIG. 4 (*a*) is a schematic plan view illustrating a semiconductor device 100B as another embodiment of the present invention, (b) is a schematic cross-sectional view of the semiconductor device 100B as viewed on the plane B-B' shown in FIG. 4(*a*), and (c) is a plan view illustrating the conductive layer of the semiconductor device 100B.

FIG. 6 (*a*) through (*d*) schematically illustrate respective process steps to fabricate the semiconductor device 100A.

FIG. 7 (*a*) through (*d*) schematically illustrate respective process steps to fabricate the semiconductor device 100A.

FIG. 8 (*a*) through (*c*) schematically illustrate respective process steps to fabricate the semiconductor device 100B.

DESCRIPTION OF EMBODIMENTS

Hereinafter, embodiments of a semiconductor device according to the present invention will be described with reference to the accompanying drawings. A semiconductor device as an embodiment of the present invention may be a TFT substrate for use in a liquid crystal display device, for example. However, the present invention is in no way limited to that specific embodiment.

Figure 1:
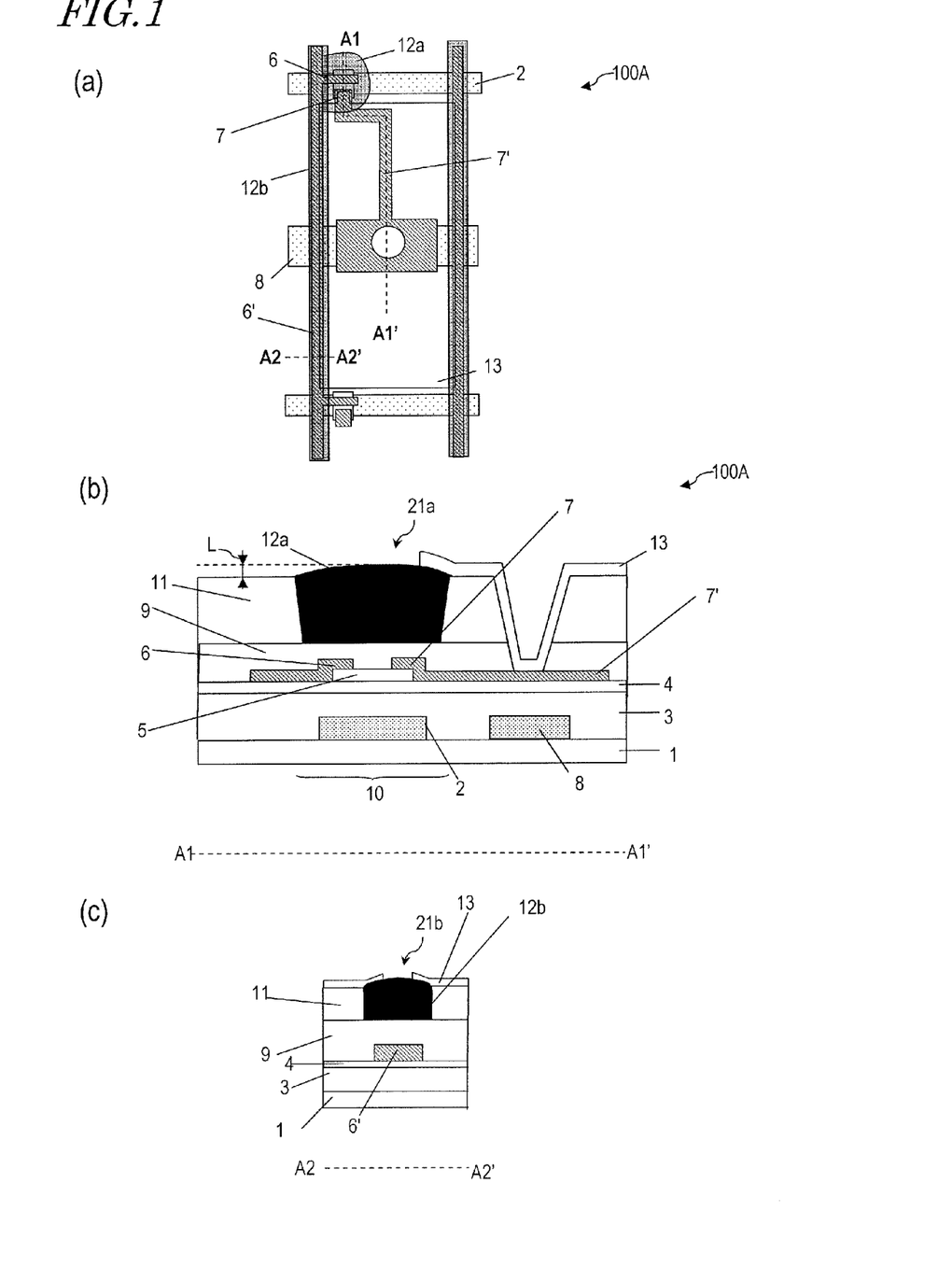
Figure 2:
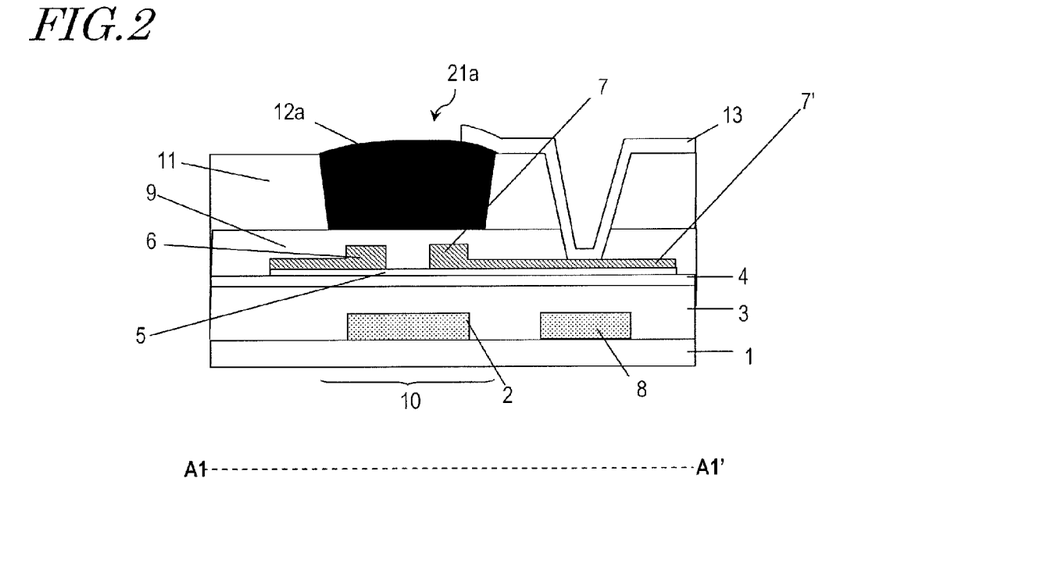
FIG. 2 A schematic cross-sectional view illustrating a semiconductor device 100A as a modified example of the device shown in FIG. 1(*b*).

FIG. 1(*a*) is a schematic plan view illustrating a semiconductor device 100A as an embodiment of the present invention. FIG. 1(*b*) is a schematic cross-sectional view of the semiconductor device 100A as viewed on the plane A1-A1' shown in FIG. 1(*a*). FIG. 1(*c*) is a schematic cross-sectional view of the semiconductor device 100A as viewed on the plane A2-A2' shown in FIG. 1(*a*). And FIG. 2 is a schematic cross-sectional view illustrating a semiconductor device 100A as a modified example of the device shown in FIG. 1(*b*).

As shown in FIGS. 1(*a*) and 1(*b*), the semiconductor device 100A includes a substrate (e.g., a glass substrate) 1 and a TFT 10 which is supported on the substrate 1. The TFT 10 includes a source electrode 6, a drain electrode 7, and an oxide semiconductor layer 5. The TFT 10 may be provided for each pixel, for example. The semiconductor device 100A further includes a first insulating layer 9 which has been deposited on the TFT 10, a second insulating layer 11 which has been stacked on the first insulating layer 9 and which has a hole 21*a*, and an opaque layer 12*a* which is arranged so as to overlap the oxide semiconductor layer 5 when viewed along a normal to the substrate 1. The opaque layer 12*a* has been formed in the hole 21*a*. The opaque layer 12*a* has a curved upper surface and the upper surface of the second insulating layer 11 is located closer to the substrate 1 than the upper surface of the opaque layer 12*a* is. That is to say, the upper surface of the opaque layer 12*a* is raised upward with respect to the upper surface of the second insulating layer 11. Although the hole 21*a* illustrated in FIG. 1(*b*) is a through hole, the hole 21*a* may also be replaced with a recess. Nevertheless, it is recommended that the hole 21*a* be a through hole. The reason is that oxygen included in the opaque layer 12*a* would be supplied to the oxide semiconductor layer 5 more easily through the through hole as will be described in detail later.

Also, as shown in FIGS. 1(*a*) and 1(*c*), the semiconductor device 100A further includes a source line 6' which runs in the column direction and another opaque layer 12*b* which is arranged so as to overlap the source line 6' when viewed along a normal to the first substrate. The source line 6' is electrically connected to the source electrode 6 of the TFT 10. The second insulating layer 11 has another hole 21*b*, in which the opaque layer 12*b* has been formed. The opaque layer 12*b* also has a curved upper surface and the upper surface of the second insulating layer 11 is located closer to the substrate 1 than the upper surface of the opaque layer 12*b* is. The opaque layer 12b may function as a black matrix (BM), for example. With the BM arranged on the semiconductor device 100A that is the TFT substrate, if a liquid crystal display device has been fabricated using the semiconductor device 100A, there is no need to provide any BM for a color filter substrate that faces the semiconductor device 100A. In addition, the magnitude of misalignment between the TFT 10 and the BM can be reduced. And as the BM does not have to have a broad area, each pixel can have an increased aperture ratio. Even though the hole 21b illustrated in FIG. 1(c) is a through hole, the hole 21b may be replaced with a recess, too.

If the opaque layers 12a and 12b each have a curved upper surface and if the upper surface of the second insulating layer 11 is located closer to the substrate 1 than the upper surface of the opaque layer 12a, 12b is, it is possible to prevent the intended alignment of liquid crystal molecules in the liquid crystal layer (not shown) on the TFT from being disturbed when a voltage is applied thereto, for example. Particularly when a liquid crystal display device including this semiconductor device 100A is a vertical alignment liquid crystal display device, this effect can be achieved remarkably. On top of that, if the opaque layers 12a and 12b each have a curved upper surface and if the upper surface of the second insulating layer 11 is located closer to the substrate 1 than the upper surface of the opaque layer 12a, 12b is, defects that would otherwise be caused by rubbing treatment can be reduced significantly.

The opaque layers 12a and 12b are suitably made of a black resin, which may be an acrylic resin including a titanium black pigment or a carbon black pigment, for example. If the opaque layers 12a and 12b are made of a black resin, then the opaque layers 12a and 12b absorb the light that is going to irradiate the oxide semiconductor layer 5 of the TFT 10. Thus, it is possible to prevent the characteristic of the TFT 10 from being affected by the incoming light. As will be described later, these opaque layers 12a and 12b can be formed easily by inkjet method, thus contributing to cutting down the manufacturing cost. If the opaque layers 12a and 12b are formed by inkjet method, then the opaque layers 12a and 12b can be formed selectively only in the intended areas, and therefore, defects that would ordinarily be caused by the opaque layers 12a and 12b can be avoided most of the time. Furthermore, since the black resin can supply oxygen to the oxide semiconductor layer 5, oxygen deficiencies in the oxide semiconductor layer 5 can be reduced.

The second insulating layer 11 suitably has either oil repellency (i.e., the property of repelling oil but not repelling water) or liquid repellency (i.e., the property of repelling both water and oil) with respect to the material of the opaque layers 12a and 12b. If the second insulating layer 11 has oil repellency or liquid repellency, then the opaque layers 12a and 12b can be formed to have a curved upper surface and the upper surface of the second insulating layer 11 can be located closer to the substrate 1 than the upper surface of the opaque layer 12a, 12b is.

The semiconductor device 100A further includes a conductive layer 13 on the second insulating layer 11. In this embodiment, the conductive layer 13 may be a pixel electrode layer, for example. Also, the opaque layer 12a and the second insulating layer 11 contact with each other and define an interface between them. Likewise, the opaque layer 12b and the second insulating layer 11 also contact with each other and define an interface between them. At least part of the interface between the opaque layer 12a, 12b and the second insulating layer 11 is suitably located under the conductive layer 13. If the interface between the opaque layer 12a, 12b and the second insulating layer 11 is located under the conductive layer 13, then it is possible to prevent water included in the liquid crystal layer from penetrating through the gap between the opaque layer 12a, 12b and the second insulating layer 11 and affecting the characteristic of the TFT 10.

The distance L from the crest of the upper surface of each opaque layer 12a, 12b to the upper surface of the second insulating layer 11 is suitably longer than 0 nm and equal to or shorter than 1500 nm. By setting the distance L within this range, liquid crystal molecules in the liquid crystal layer on the TFT 10 can be easily aligned just as intended because the opaque layers 12a and 12b define the tilt directions of the liquid crystal molecules under the application of a voltage, particularly when this semiconductor device 100A is used in a liquid crystal display device with a vertical alignment liquid crystal layer.

The semiconductor device shown in FIGS. 1(a) and 2 includes a source line 6' which is electrically connected to the source electrode 6 of the TFT 10 and a drain line 7' which is electrically connected to the drain electrode 7 of the TFT 10. The source line 6' is extended in the column direction. The source line 6' and the drain line 7' have been formed on a layer which is made of the same material as the oxide semiconductor layer 5. By adopting such a structure, the semiconductor device shown in FIG. 2 can be obtained by a semiconductor device manufacturing process that uses a reduced number of photomasks. For example, such a manufacturing process is disclosed in Patent Document No. 4, the entire disclosure of which is hereby incorporated by reference.

In this embodiment, the oxide semiconductor layer 5 may be an amorphous oxide semiconductor layer including In (indium), Ga (gallium) and Zn (zinc) (which will be referred to herein as an "a-IGZO layer"), for example. Alternatively, the oxide semiconductor layer 5 may also be an amorphous oxide semiconductor layer including In and Zn but no Ga (which will be referred to herein as an "a-IZO layer") or an amorphous oxide semiconductor layer including Zn but no In or Ga (which will be referred to herein as an "a-ZnO layer"). Optionally, the TFT 10 may also include, as its semiconductor layer, an amorphous silicon (a-Si) layer instead of the oxide semiconductor layer 5.

Hereinafter, this semiconductor device 100A will be described in detail.

As shown in FIGS. 1(a) to 1(c), the semiconductor device 100A includes the TFT 10 and a storage capacitor electrode 8 which are supported on the substrate 1, and a conductive layer (e.g., a pixel electrode layer in this embodiment) 13 which is electrically connected to the drain line 7' of the TFT 10. The TFT 10 is an oxide semiconductor TFT, and includes a gate electrode 2, a first gate insulating film 3 which has been formed on the gate electrode 2, a second gate insulating film 4 which has been stacked on the first gate insulating film 3, an oxide semiconductor layer 5 which has been formed on the second gate insulating film 4, and a source electrode 6 and a drain electrode 7 which have been formed on the oxide semiconductor layer 5. The semiconductor device 100A further includes a first insulating layer 9 which covers the TFT 10 and a second insulating layer 11 which has been stacked on the first insulating layer 9. The conductive layer 13 has been deposited on the second insulating layer 11 and partially contacts with opaque layers 12a and 12b. However, the conductive layer 13 is arranged so that a portion of the conductive layer 13 does not overlap with the channel region of the oxide semiconductor layer 5. The semiconductor device 100A further includes a source line 6' which is electrically connected to the source electrode 6 and a drain line 7' which is electrically connected to the drain electrode 7.

The gate electrode 2 and the storage capacitor electrode 8 may have a multilayer structure comprised of Ti (titanium), Al (aluminum) and Ti layers, for example. Alternatively, the gate electrode 2 and the storage capacitor electrode 8 may include Cu (copper) instead of Al. The gate electrode 2 and the storage capacitor electrode 8 may each have a thickness of 250 nm, for example.

The source electrode 6 and source line 6' and the drain electrode 7 and drain line 7' may have a multilayer structure comprised of MoN (molybdenum nitride), Al (aluminum) and MoN layers, for example. Alternatively, the source electrode 6 and source line 6' and the drain electrode 7 and drain line 7' may include Cu instead of Al. The source electrode 6 and source line 6' and the drain electrode 7 and drain line 7' may have a thickness of 250 nm, for example.

The first gate insulating film 3 may be made of SiN (silicon nitride) and may have a thickness of 325 nm, for example.

The second gate insulating film 4 may be made of $SiO_2$ (silicon dioxide) and may have a thickness of 50 nm, for example.

The oxide semiconductor layer 5 may include In, Ga and Zn, and may have a thickness of 50 nm, for example.

The first insulating layer 9 may be made of $SiO_2$ and may have a thickness of 250 nm, for example.

The second insulating layer 11 may be made of a photosensitive organic material and may have a thickness of 2000 nm to 4000 nm, for example.

The conductive layer 13 may be made of ITO (indium tin oxide) and may have a thickness of 50 nm to 200 nm, for example.

Next, a light irradiation experiment that was carried out by the present inventors will be described.

Figure 3:
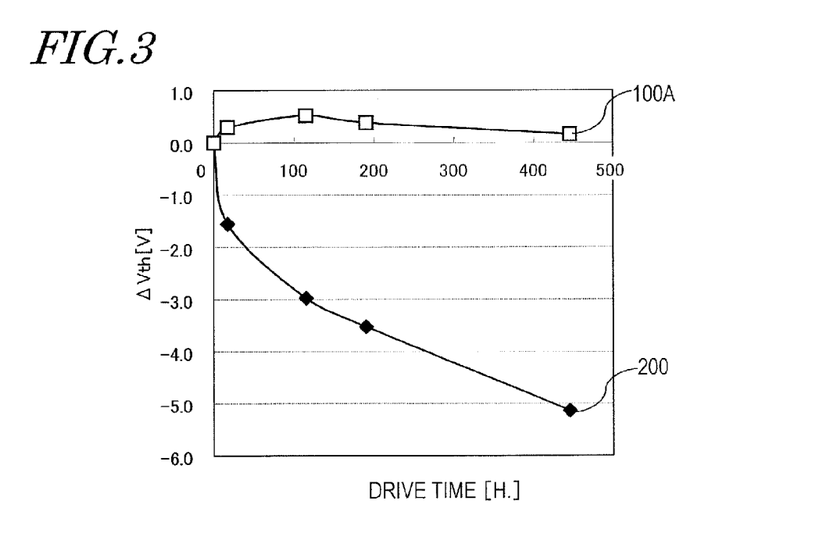
FIG. 3 A graph showing how the difference in threshold voltage (ΔVth) varied with the drive time in the semiconductor device 100A and in a semiconductor device 200.

FIG. 3 is a graph showing how the difference in threshold voltage (ΔVth) varied with the drive time (unit: hours) in the semiconductor device 100A (representing a specific example of the present invention) and in a semiconductor device 200 not including the opaque layer 12a of the semiconductor device 100A (representing a comparative example). Specifically, the semiconductor device 200 (not shown) includes a substrate (e.g., a glass substrate) 1 and a TFT 10 which is supported on the substrate 1. The TFT 10 includes a gate electrode 2, a first gate insulating film 3 which has been formed on the gate electrode 2, a second gate insulating film 4 which has been stacked on the first gate insulating film 3, an oxide semiconductor layer 5 which has been formed on the second gate insulating film 4, and a source electrode 6 and a drain electrode 7 which have been formed on the oxide semiconductor layer 5. The semiconductor device 200 further includes a first insulating layer 9 which covers the TFT 10 and a second insulating layer 11 which has been stacked on the first insulating layer 9. But the semiconductor device 200 has no opaque layer 12a or hole 21a. Each of these semiconductor devices is driven over an LED (light-emitting diode) backlight, which has a luminance of 2000 cd/m². ΔVth is the difference between the threshold voltage ($Vth_0$) of each of the semiconductor devices 100A and 200 not irradiated with the light from the LED backlight and the threshold voltage ($Vth_t$) of each of the semiconductor devices 100A and 200 irradiated with the light from the LED backlight and driven for a predetermined amount of time (i.e., $ΔVth=Vth_0-Vth_t$).

As can be seen from FIG. 3, in the semiconductor device 200 with no opaque layer 12a, ΔVth changes significantly with the drive time. In the semiconductor device 100A, on the other hand, ΔVth changes much less than in the semiconductor device 200. This is probably because the light emitted from the LED backlight would have irradiated the oxide semiconductor layer of the semiconductor device 200 to cause such a significant change in threshold voltage. In the semiconductor device 100A, on the other hand, the light that could have irradiated the oxide semiconductor layer 5 would have been absorbed into the opaque layer 12a to keep the threshold voltage substantially unchanged. Also, if the oxide semiconductor layer 5 is irradiated with the light, then the CV characteristic (electrostatic capacitance bias voltage characteristic) of the TFT changes. However, by providing the opaque layer 12a, the CV characteristic of the TFT changes much less significantly and gets stabilized.

Thus, the present inventors discovered that by providing the opaque layer 12a, the electrical characteristic of the TFT, and eventually the display quality of a liquid crystal display device, could be stabilized.

Figure 4:
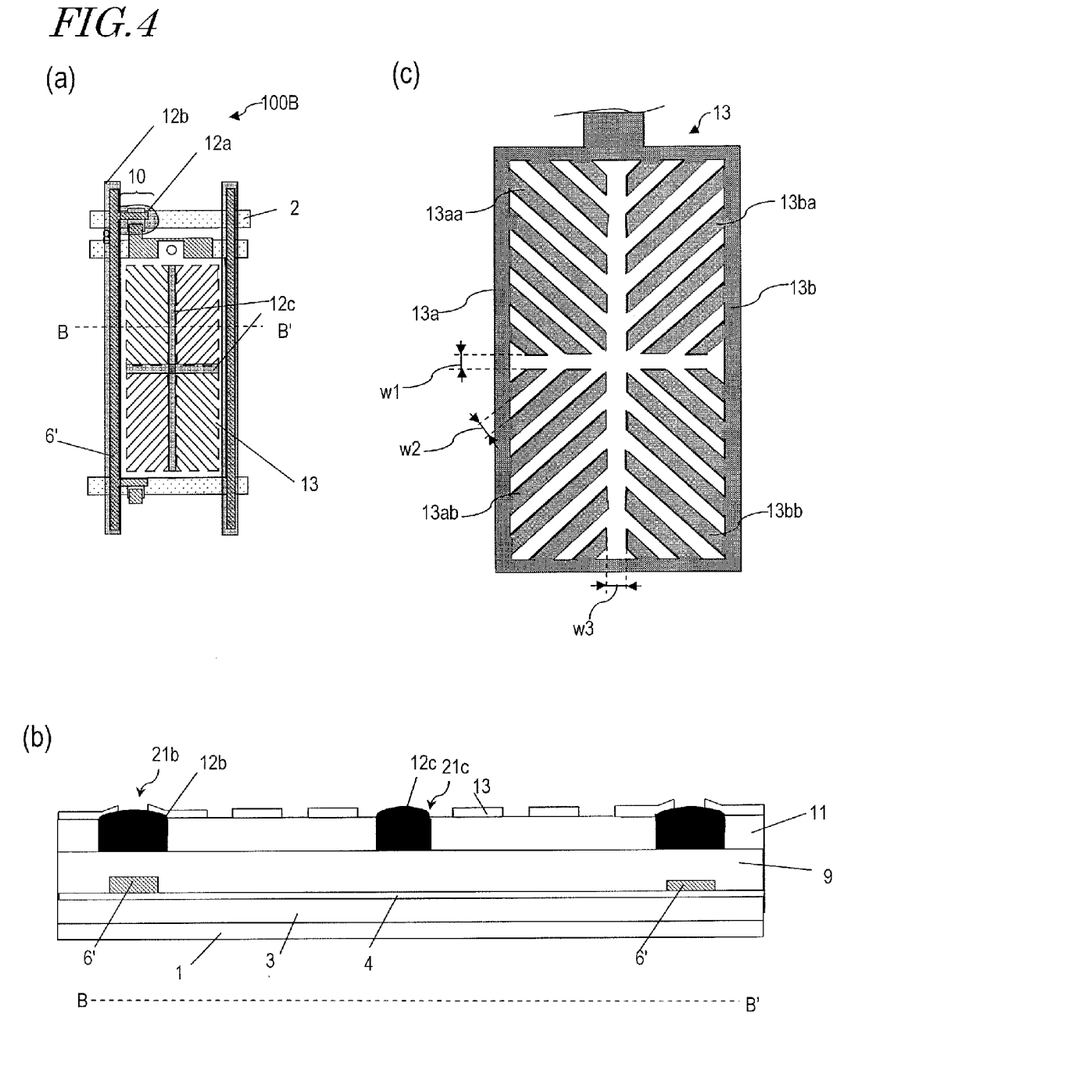

Hereinafter, a semiconductor device 100B as another embodiment of the present invention will be described with reference to FIGS. 4 and 5. In the following description, any component having substantially the same function as its counterpart of the semiconductor device 100A will be identified by the same reference numeral. And its description will be omitted herein to avoid redundancies.

FIG. 4(a) is a schematic plan view of the semiconductor device 100B. FIG. 4(b) is a schematic cross-sectional view of the semiconductor device 100B as viewed on the plane B-B' shown in FIG. 4(a). And FIG. 4(c) is a schematic plan view illustrating its conductive layer 13.

As shown in FIGS. 4(a) and 4(b), in this semiconductor device 100B, the conductive layer (e.g., pixel electrode layer) 13 of the semiconductor device 100A has substantially the same structure as the pixel electrode disclosed in Patent Document No. 5 and a crossed opaque layer 12c is provided at substantially the center of each pixel.

As shown in FIG. 4(c), the conductive layer (e.g., pixel electrode layer) 13 includes first and second fringe portions 13a and 13b that both run in a first direction, a first group of branch portions 13aa which are located on the first fringe (13a) side and which run in a second direction that is different from the first direction, a second group of branch portions 13bb which are located on the second fringe (13b) side and which run in the second direction, a third group of branch portions 13ab which are located on the first fringe (13a) side and which run in a third direction that is different from the first and second directions, and a fourth group of branch portions 13ba which are located on the second fringe (13b) side and which run in a fourth direction. Each of these first, second, third and fourth groups of branch portions 13aa, 13bb, 13ab and 13ba has a width of 1.4 µm to 8.0 µm, for example. The gap between the first and third groups of branch portions 13aa and 13ab and the gap between the second and fourth groups of branch portions 13bb and 13ba have a width w1 of 1.4 µm to 3.2 µm, for example. The gap between each pair of adjacent branches in the first, second, third and fourth groups 13aa, 13bb, 13ab and 13ba has a width w2 of 1.4 µm to 3.2 µm. And the gap between the first and fourth groups of branch portions 13aa and 13ba and the gap between the second and third groups of branch portions 13bb and 13ab have a width w3 of 1.4 µm to 3.2 µm.

Optionally, the conductive layer 13 of this semiconductor device 100B may have the same structure as the pixel electrode disclosed in one of Patent Document Nos. 5 and 6, the entire disclosure of which is hereby incorporated by reference.

The semiconductor devices 100A and 100B may be used in liquid crystal display devices independently of each other. In particular, the semiconductor device 100B may be used in a liquid crystal display device with a vertical alignment liquid crystal layer (such as an MVA (multi-domain vertical alignment) liquid crystal display device).

Figure 5:
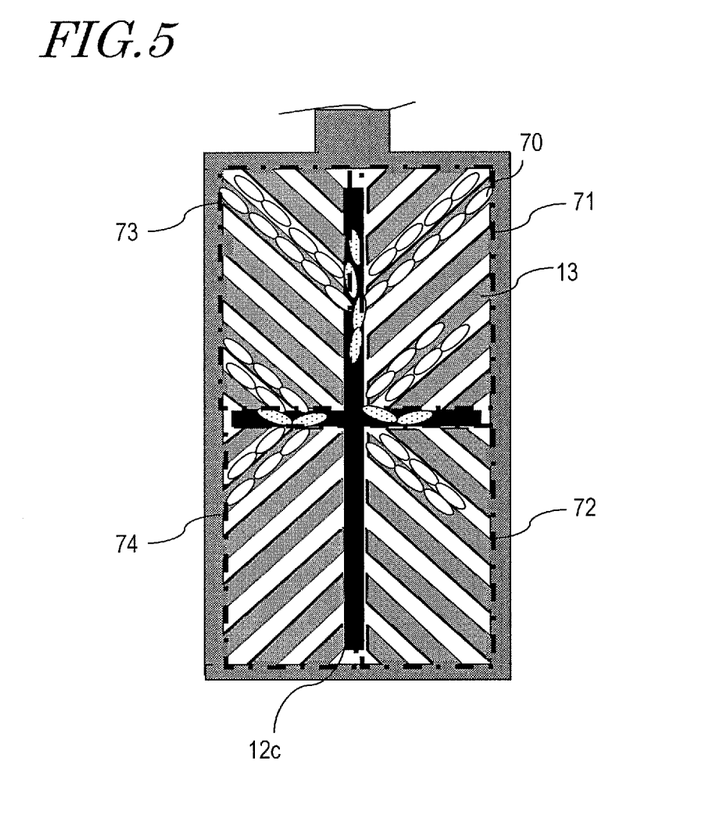
FIG. 5 A plan view illustrating how the alignment of liquid crystal molecules in a liquid crystal layer under an applied voltage is affected by the structure of the conductive layer of the semiconductor device 100B.

FIG. 5 is a plan view illustrating how the alignment of liquid crystal molecules 70 under an applied voltage is affected by the structure of the pixel electrode layer of a liquid crystal display device 500B including the semiconductor device 100B.

Each pixel region of the VA liquid crystal display device 500B has first, second, third and fourth liquid crystal domains 71, 72, 73 and 74 in which liquid crystal molecules are aligned in first, second, third and fourth directions, respectively, when a voltage is applied to the liquid crystal layer. The first, second, third and fourth directions are defined so that the difference between any two of these four directions becomes substantially an integral multiple of 90 degrees. The first, second, third and fourth liquid crystal domains 71, 72, 73 and 74 are arranged in two columns and two rows to form a matrix pattern in which each of these four liquid crystal domains is adjacent to the other liquid crystal domains. The conductive layer 13 shown in FIG. 4(c) has a structure in which the liquid crystal molecules 70 have such an alignment when a voltage is applied to them.

The opaque layer 12c is arranged so as to selectively shield, from incoming light, at least a part of the boundary area in which each of the first, second, third and fourth liquid crystal domains 71, 72, 73 and 74 is adjacent to the other liquid crystal domains. The opaque layer 12c has been formed to fill the hole 21c which has been cut through the second insulating layer 11. The opaque layer 12c has a curved upper surface and the upper surface of the second insulating layer 11 is located closer to the substrate than the upper surface of the opaque layer 12c is. Although this hole 21c is a through hole, the hole 21c may also be replaced with a recess as described above.

If the opaque layer 12c is arranged in this manner, a region of the liquid crystal layer where liquid crystal molecules do not have the intended alignment (i.e., a bright line region) is shielded by the opaque layer 12c. As a result, the display quality of the liquid crystal display device improves, particularly when viewed obliquely. In addition, since internally reflected light produced in an LCD panel can be absorbed into the opaque layer 12c, the display quality of the liquid crystal display device can be improved.

The opaque layer 12c suitably has a width of 2 μm to 5 μm. If the width of the opaque layer 12c falls within this range, the bright line region can be shielded sufficiently and the aperture ratio of each pixel does not decrease so much.

The opaque layer 12c is made of a black resin. Specifically, the black resin may be an acrylic resin including a titanium black pigment or a carbon black pigment, for example.

The opaque layer 12c and the second insulating layer 11 contact with each other to define interfaces between them. At least one of the interfaces between the opaque layer 12c and the second insulating layer 11 is located under the conductive layer 13. If the conductive layer 13 is arranged in this manner, it is possible to prevent the water included in the liquid crystal layer from penetrating through the gap between the opaque layer 12c and the second insulating layer 11 and affecting the characteristic of the TFT 10.

As described above, the distance L' (not shown) from the crest of the upper surface of the opaque layer 12c to the upper surface of the second insulating layer 11 is suitably longer than 0 nm and equal to or shorter than 1500 nm. By setting the distance L' within this range, liquid crystal molecules over the opaque layer 12c can be easily aligned just as intended because the opaque layer 12c defines the tilt directions of the liquid crystal molecules under the application of a voltage.

Figure 6:
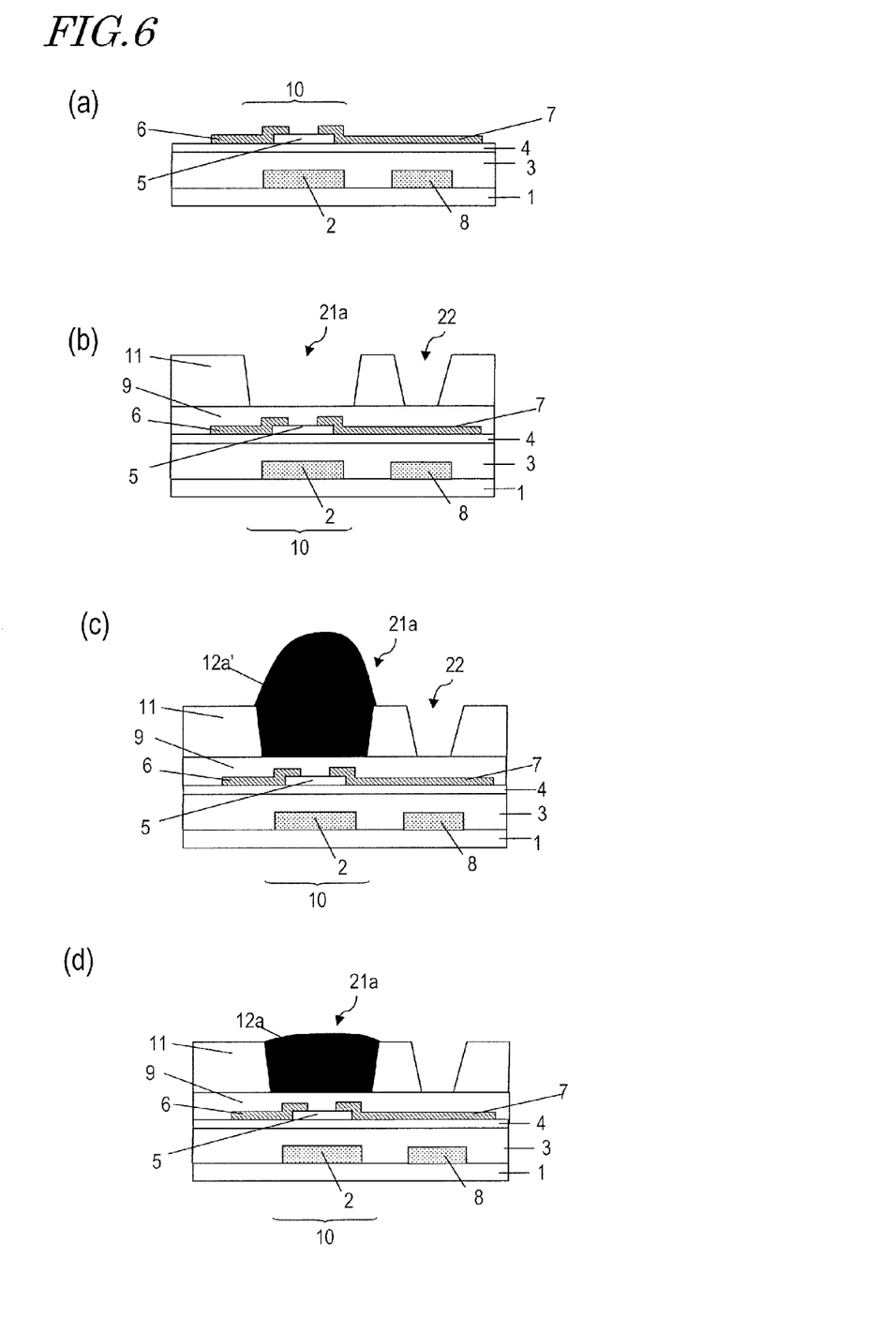
Figure 7:
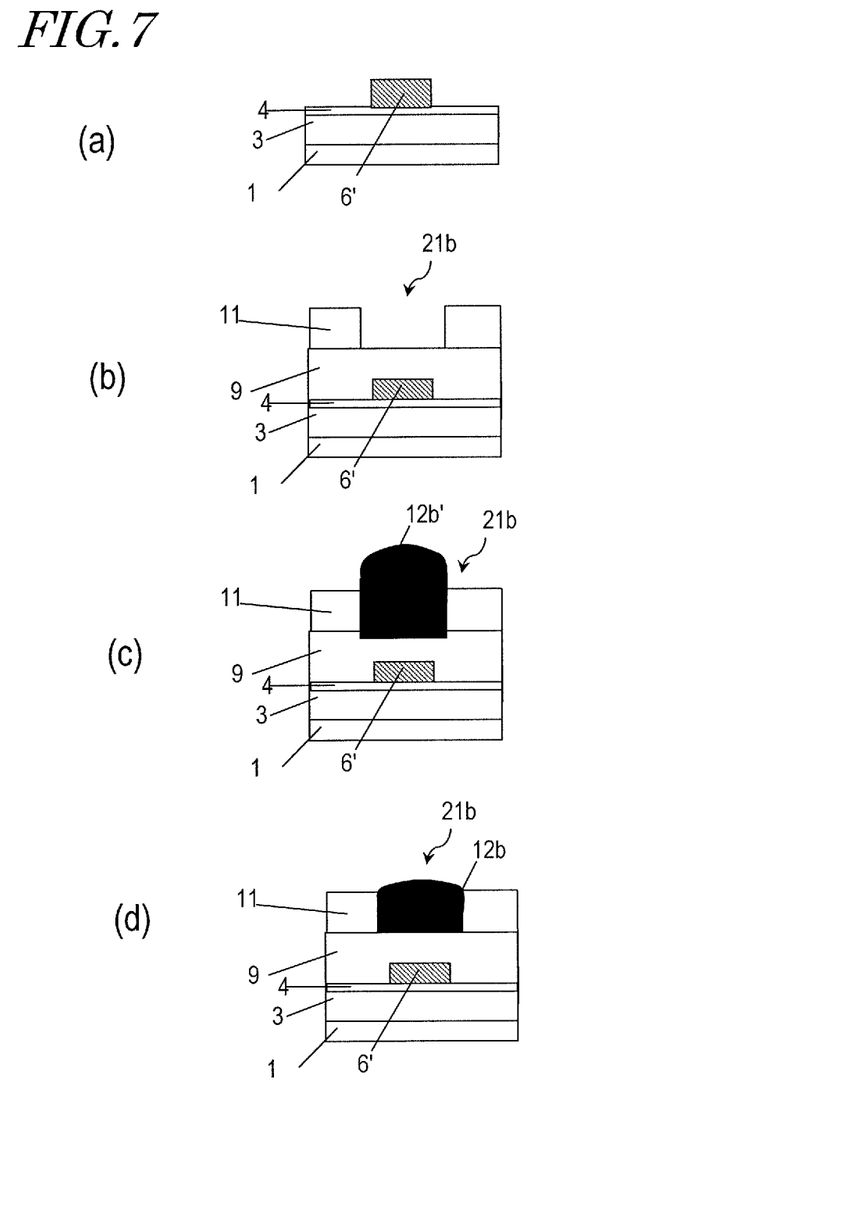
Figure 8:
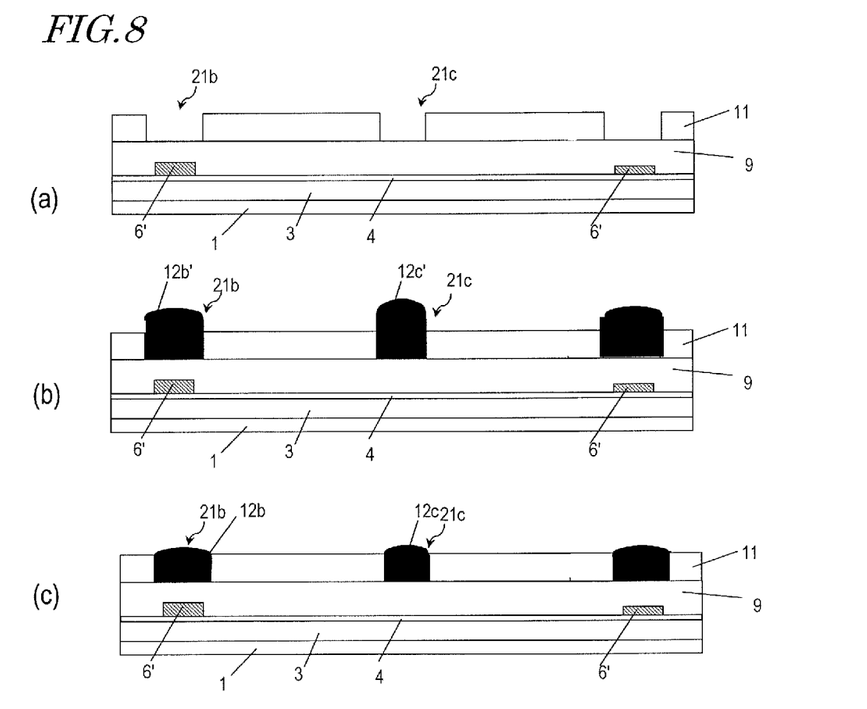

Hereinafter, it will be described with reference to FIGS. 6 through 8 how to fabricate the semiconductor devices 100A and 100B. FIGS. 6(a) through 6(d) and FIGS. 7(a) through 7(d) schematically illustrate respective process steps to fabricate the semiconductor device 100A. On the other hand, FIGS. 8(a) through 8(c) schematically illustrate respective process steps to fabricate the semiconductor device 100B. The semiconductor device 100B is obtained just by adding the opaque layer 12c to the semiconductor device 100A, and will be described along with the semiconductor device 100A. And their common features will not be described all over again.

First, as shown in FIG. 6(a), a TFT 10 including an oxide semiconductor layer 5 is formed by a known method on a substrate (such as a glass substrate) 1. Meanwhile, a source line 6' is formed on the substrate 1 as shown in FIG. 7(a).

Next, as shown in FIGS. 6(b) and 7(b), a first insulating layer 9 is formed to cover the TFT 10 and then a second insulating layer 11 of an organic material with oil repellency and photosensitivity is stacked on the first insulating layer 9. The second insulating layer 11 suitably has a low dielectric constant (of 2.0 to 4.0, for example). Optionally, the second insulating layer 11 may also have liquid repellency. The second insulating layer 11 may be obtained by patterning a film of a resist material including photosensitive novolac resin and cutting holes 21a and 21b through the film. Another hole 21c is cut in the semiconductor device 100B as shown in FIG. 8(a). And a contact hole 22, through which the drain electrode 7 will be electrically connected to the conductive layer 13 to be formed later, is also cut at the same time (as shown in FIG. 6(b)). The first and second insulating layers 9 and 11 may be formed by known methods. Optionally, these holes 21a through 21c may be replaced with recesses.

Next, as shown in FIGS. 6(c) and 7(c), the holes 21a and 21b are filled with opaque drops 12a' and 12b', respectively, by performing an inkjet process using a solution including a black resin. If the inkjet process is adopted, the opaque drops 12a' and 12b' can be easily put only in intended areas. Meanwhile, in the semiconductor device 100B, the hole 21c is also filled with another opaque drop 12c' as shown in FIG. 8(b). In this embodiment, as the solution including the black resin, a solution in which an acrylic resin including a titanium black pigment was dispersed in PGMEA (propylene glycol monomethyl acetate) was used. Also, in this embodiment, the respective holes 21a through 21c are filled with the opaque drops 12a' through 12c' so that the volumes of solid contents included in the opaque drops 12a' through 12c' will be the volumes of the opaque layers 12a through 12c to form. Specifically, if the solution including the black resin has a solid content concentration of 20% and if L=1500 nm (see FIG. 1(b)), the solution including the black resin to be dropped into one hole 21a (the bottom of which may have a 10 μm×10 μm square shape, a bottom area of 100 μm², and a height of 2 μm), may have a volume of approximately 1600 fL (femtoliters), and the solution including the black resin to be dropped into another hole 21c (the bottom of which may have a which of 5 μm, a length of 100 μm, a bottom area of 500 μm², and a height of 2 μm), may have a volume of approximately 8 pL (picoliters).

Subsequently, as shown in FIGS. 6(d) and 7(d), the solvent included in the opaque drops 12a' and 12b' is vaporized by low-pressure drying process, for example, and then a baking process is carried out at 220° C. for one hour, thereby curing the opaque drops 12a' and 12b' to form the opaque layers 12a and 12b. Meanwhile, in the semiconductor device 100B, the opaque drop 12c' is also cured in the same way under the condition described above, thereby forming the opaque layer 12c as shown in FIG. 8(c).

If the second insulating layer 11 is made of an organic material with oil repellency (or liquid repellency), e.g., a photosensitive fluorine resin such as Opto Ace (produced by Daikin Industries, Ltd.), then the opaque layers 12a to 12c have a curved upper surface and the upper surface of the second insulating layer 11 is located closer to the substrate 1 than the upper surface of the opaque layers 12a through 12c is in the resultant structure.

Thereafter, after the contact hole has been cut by a known method to reach the drain line 7' as shown in FIG. 1, a conductive layer 13 is formed to complete the semiconductor device 100A. The semiconductor device 100B is also completed in the same way (see FIG. 4). The conductive layer 13 is suitably arranged so that a portion of the conductive layer 13 is located over the interface between the opaque layer(s) 12a and/or 12b and the second insulating layer 11. The reason is that by arranging the conductive layer 13 so that a portion of the conductive layer 13 is located over the interface between the opaque layer(s) 12a and/or 12b and the second insulating layer 11, the interface between the opaque layer(s) 12a and/or 12b and the second insulating layer 11 can be covered with a portion of the conductive layer 13 without increasing the number of manufacturing process steps. Likewise, the conductive layer 13 is suitably arranged so that a portion of the conductive layer 13 is located over the interface between the opaque layer 12c and the second insulating layer 11. The reason is that by arranging the conductive layer 13 so that a portion of the conductive layer 13 is located over the interface between the opaque layer 12c and the second insulating layer 11, the interface between the opaque layer 12c and the second insulating layer 11 can be covered with a portion of the conductive layer 13 without increasing the number of manufacturing process steps.

However, the organic material with oil repellency for use to make the second insulating layer 11 is expensive. That is why the semiconductor device 100A can be fabricated at a lower cost by adopting the following method instead of using that organic material.

Hereinafter, an alternative method for fabricating the semiconductor device 100A according to another embodiment will be described with reference to FIG. 6 again. It should be noted that even though its description will be omitted herein, the semiconductor device 100B can also be fabricated by the method to be described below.

First of all, as shown in FIGS. 6(b) and 7(b), the multilayer structure is formed through the second insulating layer 11 in the same way as described above. In this example, however, the material of the second insulating layer does not have to have oil repellency (or liquid repellency). The second insulating layer 11 may be made of a photosensitive resist material including a novolac resin, for example.

Next, the second insulating layer 11 is patterned by a known method, thereby cutting the holes 21a and 21b. In the meantime, a contact hole 22, through which the drain electrode 7 will be electrically connected to the conductive layer 13 to be formed later, is also cut at the same time. Optionally, these holes 21a through 21c may be replaced with recesses.

Subsequently, a process for giving oil repellency (or liquid repellency) to the side surfaces of the second insulating layer 11, which are exposed inside the holes 21a and 21b, and the upper surface of the second insulating layer around the holes 21a and 21b is carried out. Specifically, plasma processing is performed using a fluorine gas.

In this embodiment, the plasma processing using the fluorine gas was carried out using a vacuum pressure dry etching system with $CF_4$ (carbon tetrafluoride) and He (helium) gases supplied at a flow rate of 150 sccm to 300 sccm and at a flow rate of 0 sccm to 500 sccm, respectively, and at a gas pressure of 50 mTorr to 150 mTorr (corresponding to approximately 6.7 Pa to approximately 20 Pa), at a power of 200 W to 300 W applied, for a processing time of 20 sec to 90 sec, and at a processing temperature of 40° C. A portion of the second insulating layer 11 subjected to such processing would have oil repellency (or liquid repellency).

Another plasma processing using a fluorine gas was carried out using a direct type atmospheric pressure plasma system with $CF_4$ and $N_2$ (nitrogen) gases supplied at a flow rate of 5.0 slm to 15 slm and at a flow rate of 20 slm to 50 slm, respectively, and at a gas pressure of 300 mTorr to 800 mTorr (corresponding to approximately 40 Pa to approximately 107 Pa), at a transport velocity of 0.5 m/min to 3.0 m/min, and at a processing temperature of 25° C. to 35° C. Examples of gases for use in the plasma processing include not only $CF_4$ but also $SF_6$ (sulfur hexafluoride), $CHF_3$ (trifluoromethane) and $C_3F_6$ (ethane hexafluoride) gases as well. Optionally, the fluorine based gas and an inert gas such as He or N2 gas may also be mixed together.

By performing such processing, the processed portion of the second insulating layer 11 becomes oil repellent (or liquid repellent).

Thereafter, as shown in FIGS. 6(c) and 6(d) and FIGS. 7(c) and 7(d), the holes 21a and 21b are filled with the opaque layers 12a and 12b, respectively, by the method described above.

Even if such a method is adopted, the opaque layers 12a and 12b also have a curved upper surface and the upper surface of the second insulating layer 11 is also located closer to the substrate 1 than the upper surface of the opaque layers 12a and 12b is in the resultant structure.

Thereafter, after the contact hole has been cut by a known method to reach the drain line 7' as shown in FIG. 1, a conductive layer 13 is formed to complete the semiconductor device 100A.

Thus, embodiments of the present invention provide a semiconductor device, of which the TFT performance and display quality are not easily affected by the incoming light, a method for fabricating such a semiconductor device, and a liquid crystal display device.

INDUSTRIAL APPLICABILITY

The present invention has a broad variety of applications and is applicable to any kind of semiconductor device with TFTs and to an electronic device in any field that uses such a semiconductor device. For example, the present invention may be used in an active-matrix-addressed liquid crystal display device and an organic EL display device. Such a display device may be used as either the display screen of a cellphone or a portable game console or the monitor of a digital camera. Consequently, the present invention is applicable to any kind of electronic device including a built-in LCD or organic EL display device.

REFERENCE SIGNS LIST 1 substrate
2 gate electrode
3, 4 gate insulating film
5 oxide semiconductor layer 6 source electrode
6' source line
7 drain electrode
7' drain line
8 storage capacitor electrode
9 first insulating layer
10 TFT
11 second insulating layer
12a, 12b opaque layer
13 conductive layer
21a, 21b hole
100A semiconductor device

The invention claimed is:

1. A liquid crystal display device, comprising a semiconductor device and a vertical alignment liquid crystal layer, wherein
   each pixel region of the liquid crystal display device has first, second, third and fourth liquid crystal domains in which liquid crystal molecules are aligned in first, second, third and fourth directions, respectively, when a voltage is applied to the liquid crystal layers;
   the first, second, third and fourth directions are defined so that the difference between any two of these four directions becomes substantially an integral multiple of 90 degrees;
   the first, second, third and fourth liquid crystal domains are arranged in two columns and two rows to form a matrix pattern in which each of these four liquid crystal domains is adjacent to the other liquid crystal domains;
   the semiconductor device comprises:
      a substrate;
      a thin-film transistor which is supported on the substrate and which includes a source electrode, a drain electrode, and an oxide semiconductor layer;
      a first insulating layer formed over the thin-film transistor;
      a second insulating layer formed on the first insulating layer and which has either a first hole or a first recess;
      a first opaque layer arranged so as to overlap the oxide semiconductor layer when viewed along a normal to the substrate; and
      a second opaque layer arranged so as to selectively shield, from incoming light, at least a part of a boundary area in which each of the first, second, third and fourth liquid crystal domains is adjacent to the other liquid crystal domains;
   the first opaque layer is formed in the first hole or the first recess;
   the first opaque layer has a raised and curved upper surface and the upper surface of the second insulating layer is located closer to the substrate than the upper surface of the first opaque layer is;
   the second insulating layer further has either a second hole or a second recess;
   the second opaque layer is formed in the second hole or the second recess; and
   the second opaque layer has a raised and curved upper surface and the upper surface of the second insulating layer is located closer to the substrate than the upper surface of the second opaque layer is.

2. The liquid crystal display device of claim 1, wherein the distance from the upper surface of the second insulating layer to the crest of the upper surface of the second opaque layer is longer than 0 nm and equal to or shorter than 1500 nm.

3. The liquid crystal display device of claim 2, wherein the second opaque layer is made of a black resin.

4. The liquid crystal display device of claim 1, comprising a conductive layer formed on the second insulating layer,
   wherein the second opaque layer and the second insulating layer contact with each other to define a first interface; and
   the first interface is at least partially located under the conductive layer.

5. A method for fabricating the liquid crystal display device of claim 1, comprising the step of making the second insulating layer of an organic material with oil repellency.

6. A method for fabricating the liquid crystal display device of claim 1, comprising the steps of:
   (A) forming the second insulating layer; and
   (B) making the second insulating layer oil repellent by performing plasma processing using a fluorine based gas after the step (A) has been performed.

7. The liquid crystal display device of claim 1, wherein the distance from the upper surface of the second insulating layer to the crest of the upper surface of the first opaque layer is longer than 0 nm and equal to or shorter than 1500 nm.

8. The liquid crystal display device of claim 1, wherein the first opaque layer is made of a black resin.

9. The liquid crystal display device of claim 1, further comprising:
   a source line which is electrically connected to the source electrode; and
   a third opaque layer which is arranged so as to overlap the source line when viewed along a normal to the substrate; wherein
   the second insulating layer further has either a third hole or a third recess;
   the third opaque layer is formed in the third hole or the third recess, and
   the third opaque layer has a raised and curved upper surface and the upper surface of the second insulating layer is located closer to the substrate than the upper surface of the third opaque layer is.

10. The liquid crystal display device of claim 9, wherein the distance from the upper surface of the second insulating layer to the crest of the upper surface of the third opaque layer is longer than 0 nm and equal to or shorter than 1500 nm.

11. The liquid crystal display device of claim 9, wherein the third opaque layer is made of a black resin.

12. The liquid crystal display device of claim 9, comprising a conductive layer formed on the second insulating layer, wherein
   the second insulating layer and the first opaque layer contact with each other to define a second interface;
   the second insulating layer and the third opaque layer contact with each other to define a third interface, and
   either the second interface or the third interface is at least partially located under the conductive layer.

13. The liquid crystal display device of claim 9, further comprising a drain line which is electrically connected to the drain electrode,
   wherein the source line and the drain line are formed on a layer that is made of the same material as the oxide semiconductor layer.

14. The liquid crystal display device of claim 1, wherein the oxide semiconductor layer includes In, Ga, and Zn.

15. The liquid crystal display device of claim 1, wherein the second insulating layer has oil repellency.

* * * * *